United States Patent [19]

Sato

[11] Patent Number: 5,582,641

[45] Date of Patent: Dec. 10, 1996

[54] CRYSTAL ARTICLE AND METHOD FOR FORMING SAME

[75] Inventor: Nobuhiko Sato, Atsugi, Japan

[73] Assignee: Canon Kabushiki Kaisha, Tokyo, Japan

[21] Appl. No.: 445,555

[22] Filed: May 22, 1995

Related U.S. Application Data

[63] Continuation of Ser. No. 166,909, Dec. 15, 1993, abandoned, which is a continuation of Ser. No. 847,883, Mar. 10, 1992, abandoned, which is a continuation of Ser. No. 415,770, Oct. 2, 1989, abandoned.

[30] Foreign Application Priority Data

Oct. 2, 1988 [JP] Japan .................................. 63-247816
Sep. 29, 1989 [JP] Japan .................................. 1-255525

[51] Int. Cl.$^6$ ........................................... C30B 25/18
[52] U.S. Cl. ........................... 117/97; 117/106; 117/913; 117/923
[58] Field of Search ....................... 117/70, 106, 97, 117/913, 923; 148/332

[56] References Cited

U.S. PATENT DOCUMENTS

| | | | |
|---|---|---|---|
| 2,921,362 | 1/1960 | Nomura | 148/33.2 |
| 2,929,006 | 3/1960 | Herlet | 148/33.2 |
| 3,016,313 | 1/1962 | Pell | 148/33.2 |
| 3,385,729 | 5/1968 | Larchian | 148/33.2 |
| 3,425,879 | 2/1969 | Shaw et al. | 156/612 |
| 3,514,346 | 5/1970 | Cray | 148/33.2 |
| 4,000,019 | 12/1976 | van der Brekel | 156/612 |
| 4,670,969 | 6/1987 | Yamada et al. | 148/33.2 |

FOREIGN PATENT DOCUMENTS

| | | | |
|---|---|---|---|
| 240309 | 10/1987 | European Pat. Off. | 156/610 |
| 0284437 | 9/1988 | European Pat. Off. | |
| 63-239184 | 10/1988 | Japan | 156/600 |
| 63-239187 | 10/1988 | Japan | 156/612 |

OTHER PUBLICATIONS

T. Tonchara et al., "Manipulation of nucleation sites and periods over amorphous substrates", Applied Physics Letters, vol. 52, No. 15, Apr. 1988 pp. 1231–1233.

X. Gerbaux et al., "Applicability of the epitaxial nucleation in submicroslopie holes (ENSH) method to vapour growth: Preparation of oriented thin films of naphthalene, durene, benzoic acid and tellurium", Journal of Crystal Growth, vol. 47, 1979, pp. 593–504, Amsterdam, NL.

*Primary Examiner*—Robert Kunemund
*Attorney, Agent, or Firm*—Fitzpatrick, Cella, Harper & Scinto

[57] ABSTRACT

A crystal article comprises a substrate and single crystals provided on said substrate, with the shape of the contacted surface of said single crystals with said substrate being n-gonal (provided that n≥5) or circular.

4 Claims, 7 Drawing Sheets

CRYSTAL ARTICLE AND METHOD FOR FORMING SAME

This application is a continuation of application Ser. No. 08/166,909 filed Dec. 15, 1993, now abandoned, which is a continuation of application Ser. No. 07/847,883 filed Mar. 10, 1992, now abandoned, which is a continuation of application Ser. No. 07/415,770 filed Oct. 2, 1989, which is now abandoned.

BACKGROUND OF THE INVENTION

1. Field of the invention

This invention relates to a crystal article and a method for forming the same, particularly to a crystal article having a plurality of single crystals formed on a deposition surface with their positions being controlled, and also with the positions of the grain boundaries formed at the portions where the single crystals mutually contact each other and the sizes of the single crystals being controlled, and a method for forming the same.

The present invention is applicable to single crystals to be utilized for production of, for example, electronic elements such as semiconductor integrated circuits, magnetic circuits, etc., optical elements, magnetic elements, piezoelectric elements, or surface acoustic elements, etc.

2. Related Background Art

In the field of SOI technique which grows a plurality of single crystals on an insulating substrate, for example, there has been proposed, for example, the method based on selective nucleation depending on the difference in nucleation density between the surface materials (T. Yonehara et al (1987), Extended Abstracts of the 19 th SSDM. 191). The crystal formation method is to be described by referring to FIGS. 1A–1C. First, as shown in FIG. 1A, on a substrate 301 having a surface 302 with small nucleation density are arranged regions 303a, 303b having surfaces with sufficiently larger nucleation density than the surface 302 with a diameter of a and an interval b. If a predetermined crystal formation treatment is applied on the substrate, crystal nuclei of the deposited product will be generated only on the surfaces of the regions 303a, 303b, and never on the surface 302 (see FIG. 1B). Accordingly, the surfaces of the regions 303a, 303b are called nucleation surfaces ($S_{NDL}$) and the surface 302 non-nucleation surface ($S_{NDS}$). If the nuclei 304a, 304b generated on the nucleation surfaces 303a, 303b are further permitted to grow, they become the single crystals 305a, 305b (see FIG. 1C), growing onto the non-nucleation surface 302 beyond the regions of the nucleation surfaces 303a, until contacting the single crystal 305b grown from the adjacent nucleation surface 303b to form a grain boundary 306. In the crystal formation method of the prior art, there have been reported an example, in which the nucleation surfaces 303a, 303b are formed of amorphous $Si_3N_4$, the non-nucleation surface 302 formed of $SiO_2$, and a plurality of Si single crystals are formed according to the CVD method (see the above essay), and an example, in which the non-nucleation surface formed of $SiO_2$, the region which becomes the nucleation surface is formed by implanting Si ions into the non-nucleation surface with a focused ion beam, and subsequently a plurality of Si single crystals are formed according to the CVD method (The 35 th Associated Lectures Related to Applied Physics, 1988, 28p-M-9).

However, when these single crystals are formed in lattice points according to the crystal formation method with controlled formation positions thereof, there may sometimes occur the problems as shown below, and in that case, problems may sometimes occur in forming a semiconductor integrated circuit or other electronic or optical element.

When the nucleation surfaces shown in FIGS. 1A–1C are arranged in lattice points on the non-nucleation surface as shown in FIG. 2A, and the crystal growth treatment is applied thereon, for example, the single crystal 404b grown from the nucleation surface 403b which is the nearest nucleation surface to the nucleation surface 403e contacts the single crystal 404a to form a grain boundary 405. However, at the central portion at the interval from the second nearest nucleation surface 403c relative to the nucleation surface 403e, the single crystals cannot completely contact each other, whereby a void 406 may be sometimes generated (see FIG. 2B). This void 406 may be apparently extinguished by close contact between the upper portions of the single crystals by elongating the crystal growth treatment time, but when the upper portions of the single crystals are removed to be flattened by etching or polishing so as to form a semiconductor integrated circuit, or other electronic or optical elements, etc., the void 406 may be sometimes observed to appear.

On the void 406, it is impossible to form an element utilizing the characteristics of the single crystal such as MOS transistors, diodes, etc. Further, even when a thin film intended to wiring is desired to be formed on the void 406, since the film thickness of the crystal grain after flattening is some 100 Å or higher, generally about 1 μm from the demand in formation of element, and from the point of controllability of flattening, there also sometimes occurred wire breaking at the stepped difference portion between the non-nucleation surface 402 in the void 305 and the single crystals 404a, 404b, 404c. Accordingly, when the surface portions of a plurality of single crystals formed according to the crystal formation method in which these single crystals are formed with controlled positions thereof are flattened by cutting, and a semiconductor integrated circuit or other elements, etc. are formed thereon, since the active region is formed by avoiding the void 406, the circuit constitution or the element constitution is restricted as it is lowered in degree of freedom in design, or troubles sometimes occur in miniaturization of the element.

SUMMARY OF THE INVENTION

The present invention has been accomplished in view of the various points as mentioned above, and its object is to provide a crystal article having a plurality of single crystals formed on a substrate with controlled positions and sizes as desired, which can prepare easily a semiconductor integrated circuit device or other electronic, optical elements by ensuring degree of freedom in design, and also can effect miniaturization, higher integration as a whole, and a method for forming the same.

Another object of the present invention is to provide a crystal article which has solved the above problems of the prior art by applying necessary treatment on a substrate for controlling the generation position of single crystals so that the shape of the region to be occupied by the single crystal may become n-gonal (n≧5), and thereafter permitting the single crystal to grow by applying a crystal growth treatment on the substrate, thereby inhibiting generation of the void.

Still another object of the present invention is to provide a crystal article comprising a substrate and single crystals provided on said substrate, with the shape of the contacted surface of said single crystals with said substrate being n-gonal (provided that n≧5) or circular.

Still another object of the present invention is to provide a method for forming a crystal article comprising forming a single crystal at the concavity of a substrate having a concavity formed on the surface thereof, wherein the shape of said concavity seen from the upper surface is n-gonal (provided that n≧5) or circular.

Still another object of the present invention is to provide a method for forming a crystal article, which comprises forming a single crystal by applying crystal growth treatment on a substrate having the growth origination point of the crystal, wherein the growth origination points are arranged at the positions of 6-ply symmetry.

DESCRIPTION OF THE PREFERRED EMBODIMENTS

When the substrate surface is desired to be embedded with a plurality of single crystals, the average shape of the region occupied by each single crystal is Wigner-Seitz cell formed when considering the nucleation surfaces as the lattice points (the minimum section including the central lattice point constituted as surrounded by the perpendicular bisectors of the line segments with adjacent lattice points with one lattice point as the center).

More specifically, for example, when the nucleation surfaces are arranged at the 4-ply symmetrical positions, 5-ply symmetrical positions and 6-ply symmetrical position, the shapes of the cell become tetragonal, pentagonal and hexagonal, respectively.

Figure 1A:
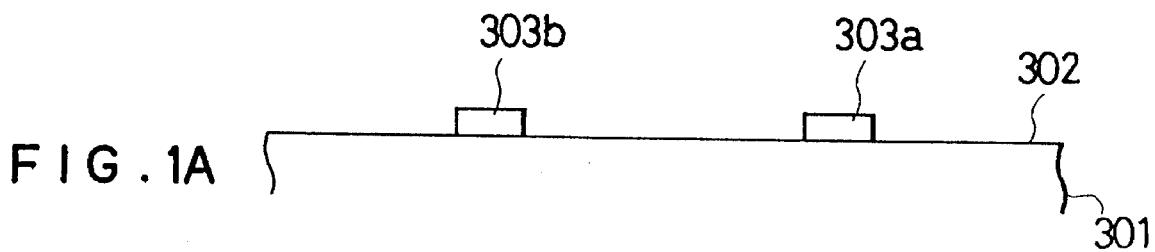
FIGS. 1A–1C are schematic illustrations for explaining the method for forming a crystal article according to the prior art.
Figure 1B:
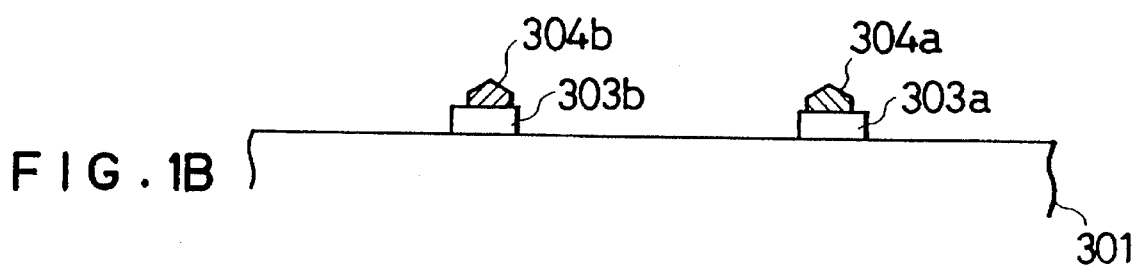
Figure 1C:
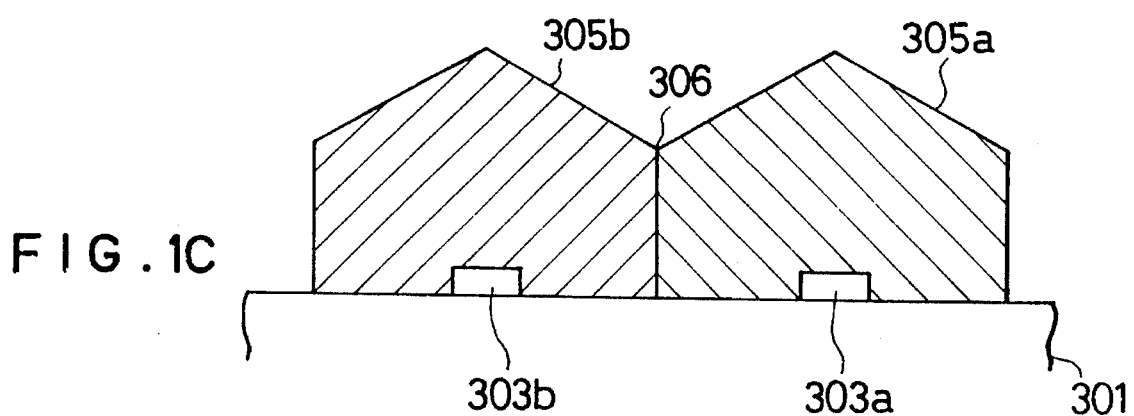
Figure 2A:
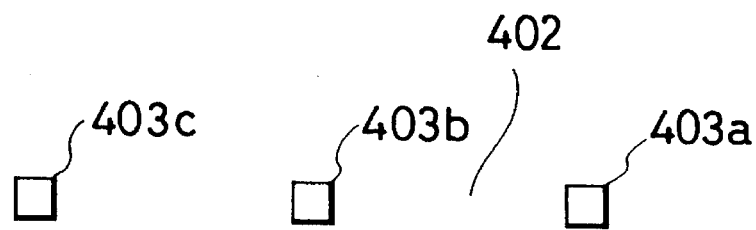
FIGS. 2A and 2B are schematic illustrations for explaining the method for forming a crystal article according to the prior art.
Figure 2B:
Figure 2B:
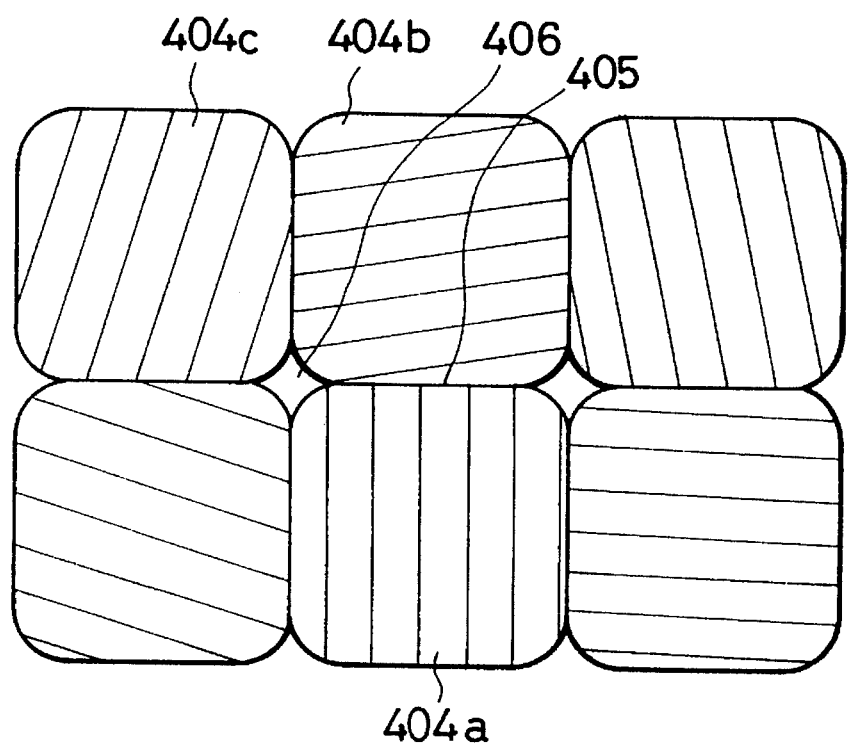
Figure 3A:
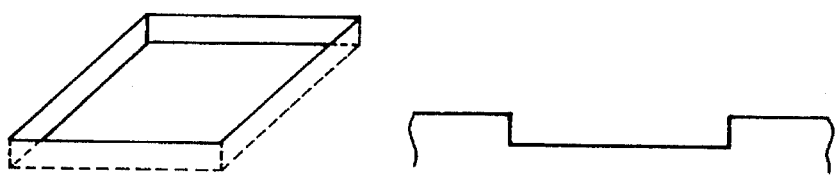
FIGS. 3A–3C are illustrations showing one example of the shape of the concavity provided on the substrate.
Figure 3B:
Figure 3C:

The present invention is based on the discovery that, when nucleation surface is arranged at the center of a concavity provided on the base material surface, and crystal growth step is applied with various sizes and shapes of the region where single crystal can grow in the lateral direction by working the shape seen from the upper surface of the concavity to many regular n-gonal such as square, regular pentagonal, regular hexagonal shapes as shown in FIGS. 3A–3C. If the shape seen from the upper surface of the concavity is a regular n-gonal (n≧5) such as pentagonal, hexagonal, etc., or "circular" shape corresponding to the limiting state when n is made infinite, the ratio of void area can be reduced to one tenth or lower of the void area ratio then when the shape of the concavity is made square, to attain a size to the extent which will pose no problem in practical application.

Also, the present invention can make the ratio of voids formed between crystals smaller without any practical problem, even when nucleation surfaces are arranged on a flat base material surface without formation of concavity on the surface of the base material and selective growth is carried out, provided that the shape of the crystal grown is a n-gonal (n≧5) which is the shape of the Wigner-Seltz cell.

The crystal grown by the selective growth method can be controlled in its size, the position of grain boundary, and therefore the shape seen from the upper surface becomes substantially the Wigner-Seitz cell as described above.

Figure 4:
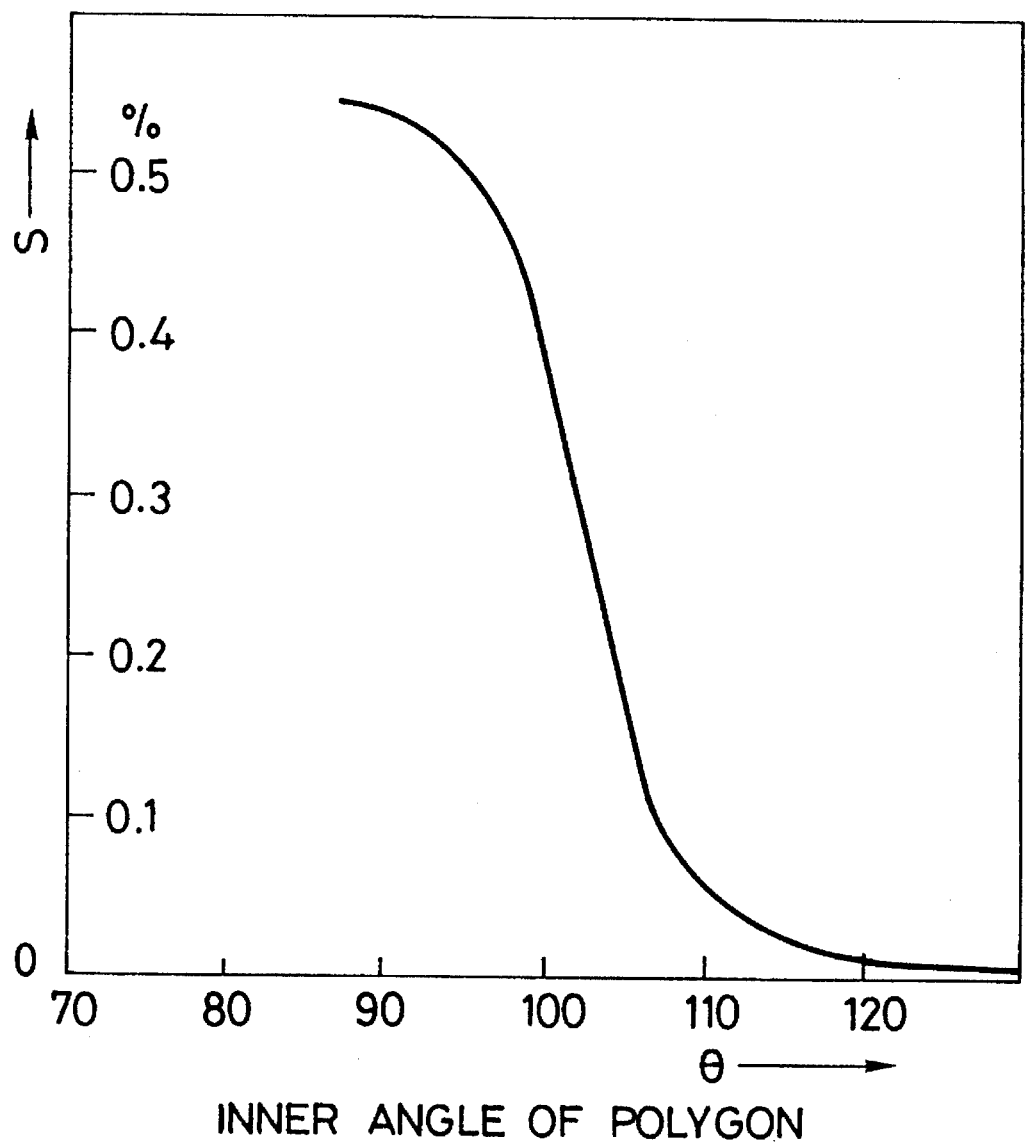
FIG. 4 is a graph showing the relationship between the inner angle of a polygon and the ratio of area of void relative to the area to be occupied by the crystal.

Here, the ratio of the void area between the crystal as grown relative to the area to be occupied by the above cell (area to be occupied by crystals) versus inner angle of the polygon is shown in FIG. 4.

As can be seen also from FIG. 4, it can be understood that the area of void will be abruptly reduced at around the inner angle of the polygon exceeding 100°.

In the present invention, by applying crystal formation treatment on the substrate applied with necessary treatment for controlling the shape of the region to be occupied with single crystals as described above in order to prevent generation of voids between a plurality of single crystals on the substrate, the size of void will become dramatically smaller as compared with the prior art, whereby there is substantially no problem such as wife breaking, etc. during wiring, etc.

Further, according to the present invention, since a flat group of single crystals without stepped difference formed by single crystals through contact with grain boundaries are obtained, in addition to acceleration of the actuation by formation of active elements such as transistors, etc. on the single crystals, it is also possible to effect further higher densitification of the element constitution by forming passive elements such as capacitor, resistance etc. at the portions crossing the grain boundaries.

Referring now to FIG. 5 to FIG. 7, the crystal article and the method for formation thereof according to the present invention are to be described. On a substrate, the treatment necessary for controlling the positions for formation of the crystals is applied. This method may be also practiced by, for example, arranging a non-nucleation surface and a plurality of nucleation surfaces having an area sufficiently small to result in the formation of only one nucleus from which a single crystal is grown and having greater nucleation density than the non-nucleation surface at desired positions on a substrate.

Here, the nucleation density of the nucleation surface should preferably be greater by at least $10^2$-fold, more preferably by at least $10^3$-fold than that of the non-nucleation surface.

Alternatively, there may also be employed the method in which a non-nucleation surface is arranged on a substrate, and fine single crystals are arranged in a plural number at desired positions on the non-nucleation surface. Alternatively, the method for controlling the positions of the single crystals may be any other method than those as described above, provided that the object of the present invention can be effectively accomplished. In any case, the important point in the present invention is that necessary treatment for positional control of the single crystal should be applied so as to form single crystals at the concavity with the surface being non-nucleation surface and the shape being n-gonal (n≧5, desirably n≧6), ellipsoidal, circular, or that the single crystals should be made with the Wigner-Seitz cell becoming n-gonal or circular without provision of concavity on the substrate.

In the present invention, as described above, when a concavity is formed on a substrates and a single crystal is formed there, the shape of the concavity seen from the upper surface is made n-gonal (n≧5, more desirably n≧6), or a shape having a curve such as ellipsoidal, circular, etc. Alternatively, when the substrate surface is desired to be embedded with a plurality of single crystals without formation of concavity, the average shape of the region occupied by each single crystal, namely the shape of Wigner-Seitz cell is made n-gonal (n≧5, more desirably n≧6) or a shape having a curve such as circular, etc. Particularly, when the shape of Wigner-Seitz cell is made regular hexagonal, honeycomb structure is obtained, whereby single crystals can be desirably juxtaposed on the substrate efficiently to make the size of void smaller.

Figure 5A:
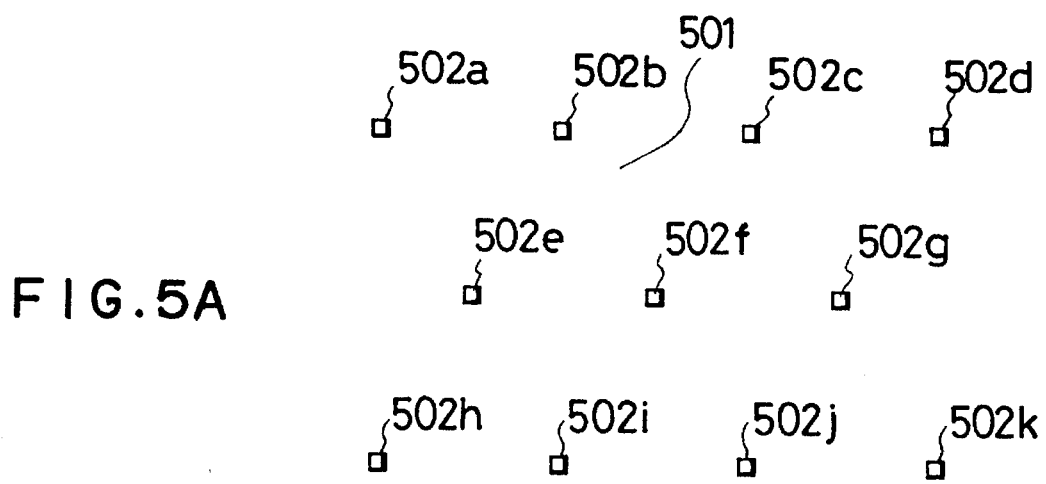
FIG. 5 to FIG. 7 are illustrations for explanation of Examples of the present invention.
Figure 5B:
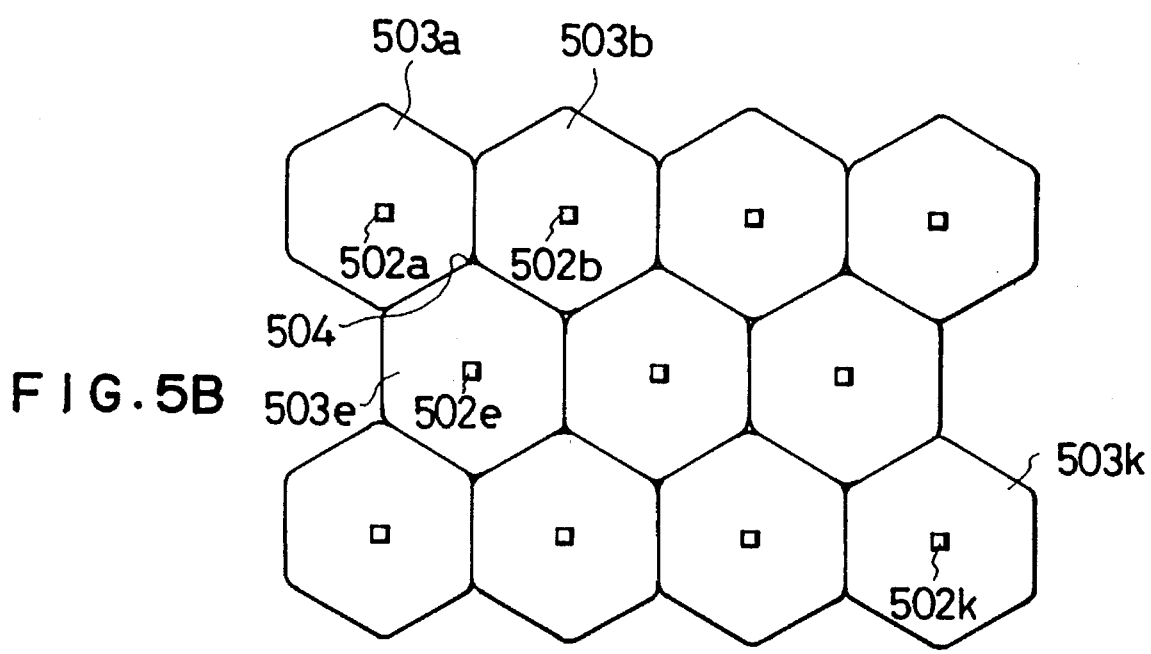

FIGS. 5A and 5B show schematically an example of the method for forming a crystal article when the shape of Wigner-Seitz cell is made regular hexagonal. FIG. 5A is a view of the substrate having nucleation surfaces 502a . . . 502k arranged on the non-nucleation surface 501 seen from the upper surface.

By applying as the crystal growth treatment a gas phase growth method such as thermal CVD, plasma CVD, optical CVD, sputtering, etc., and a liquid phase growth method such as the gradual cooling method, the temperature gradient method, etc., the crystals 503a . . . 503k will grow selectively with the nucleation surfaces 502a . . . 502k as the origination points for crystal growth.

The area of the void 504 between the crystal 503a, 503b, 503e formed at this time will become very smaller relative to the area to be occupied by the crystals.

In the present invention, the reason why the shape of the concavity provided on the substrate surface as described above is made n-gonal (n≧5) or a shape having a curve such as circular is because the value of (area of one void/area to be occupied by single crystal) is abruptly reduced immediately before n is over 5 and the inner angle is over 108°. This may be considered to be due to the fact that the shape to be occupied by single crystal approaches to the practical shape of single crystal.

Figure 6A:
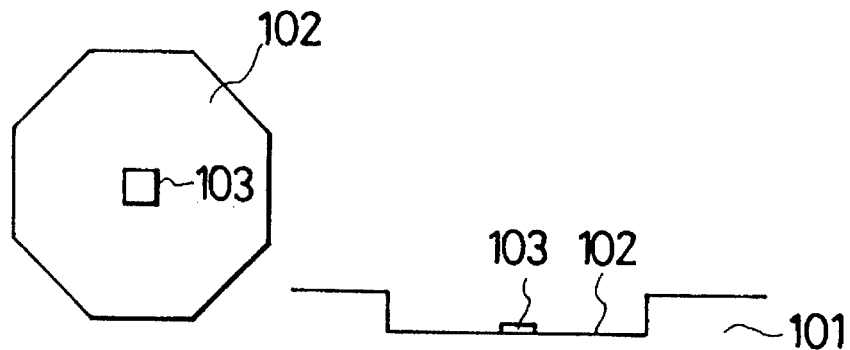
Figure 6B:
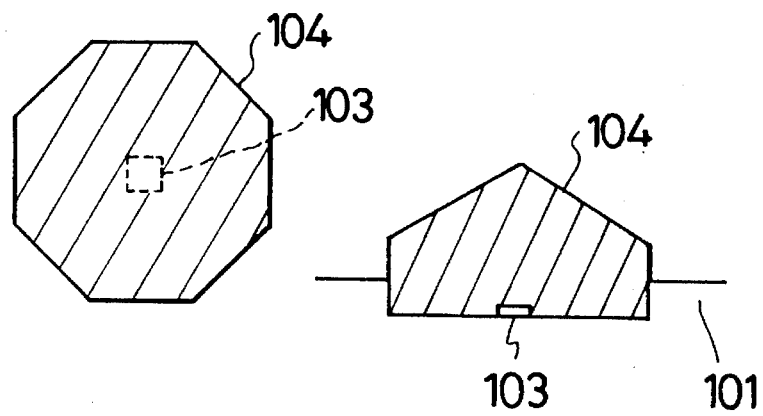

FIGS. 6A and 6B show an example of the method for forming crystal article when the concavity shape is regular octagonal.

101 is a substrate, and on the substrate 101 is provided a concavity having a regular octagonal planar shape which gives a non-nucleation surface 102, and at its center is provided a nucleation surface 103 which becomes the origination point for crystal growth. When the substrate applied with such working treatment is applied with crystal growth treatment according to a gase phase method such as CVD method or a liquid phase method under predetermined conditions for a predetermined time, a single crystal 104 with the contacted surface with the substrate being approximately regular octagonal will grow as shown in FIG. 6B.

Figure 7A:
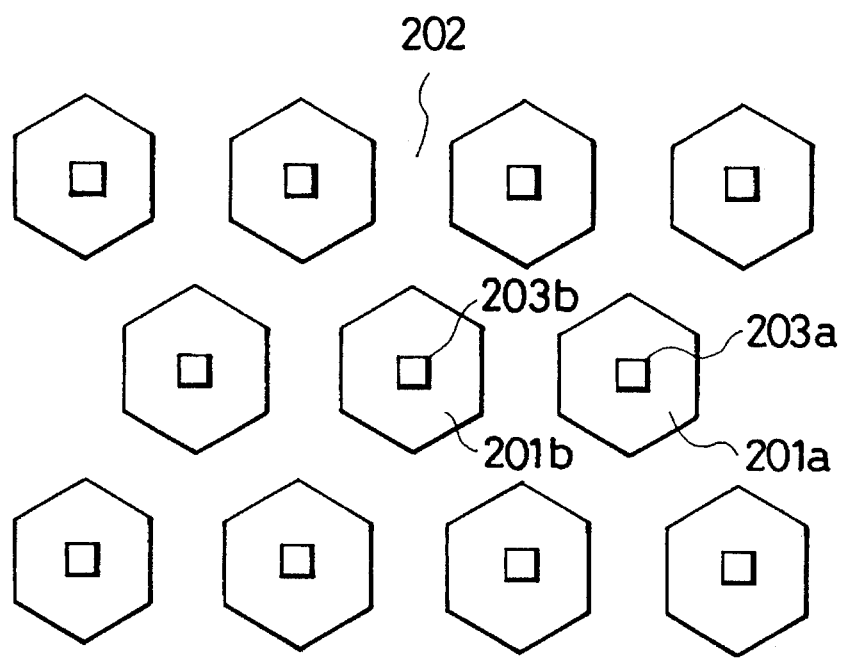
Figure 7B:
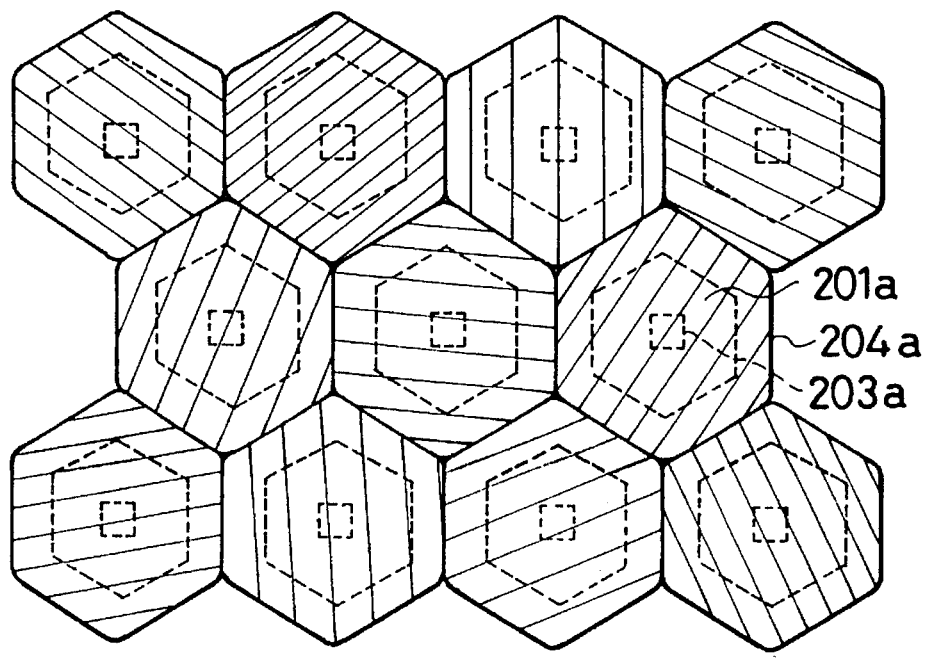

FIGS. 7A and 7B show an example of the case when a plurality of single crystals are formed. At predetermined positions of the substrate 202, first a plurality of concavities 201a, 201b . . . with regular hexagonal bottom shape are provided to desired depths. For the bottoms of the concavities 201a, 201b, and the portion other than the concavity of the substrate 202, a material with lower nucleation density than the nucleation surface is selected so as to become the non-nucleation surface. On the respective concavities 201a, 201b . . . , nucleation surfaces 203a, 203b . . . are respectively provided.

When crystal growth treatment is applied on the substrate having a plurality of concavities provided thereon by such working according to, for example, a gas phase method such as CVD method or a liquid phase method, etc., a single crystal 204a with the contacted surface with the substrate being approximately regular hexagonal will grow as shown in FIG. 7B. The single crystal 204a can be also grown by controlling the growth time until the adjacent crystals contact each other (see FIG. 7B), or alternatively it is also possible to make the adjacent single crystals formed in the respective portions without contacting each other by stopping the crystal growth treatment in the course thereof, namely under the state in which the respective single crystals are isolated from each other.

The base material for the substrate may be any material suitable for subsequent treatments, such as Si wafer, quartz glass, ceramics, etc.

As the single crystal to be grown, in addition to Si, Ge, GaAs, InP, etc., any crystal may be employed.

As the material for the nucleation surface, for example, a material with high nucleation density such as amorphous SiN, amorphous SION, etc. may be employed.

Also, when single crystalline seeds formed by heat treatment are arranged as the origination points for crystal growth on the base material, for example, a material containing a dopant such as P, B, As, etc. preferably at $1 \times 10$ atoms/cm$^3$, more preferably $7.5 \times 10^{20}$ atoms/cm$^3$ may be also employed.

In the following, Examples in which a plurality of Si single crystals are formed on a substrate based on the present invention are shown.

EXAMPLE 1

(1) First, with the use of a Si (100) wafer substrate as the base material, a first amorphous silicon oxide film with a film thickness of about 1000 Å was formed by the thermal oxidation method. Next, according to the reduced pressure CVD method by use of starting gases of SiH$_2$Cl$_2$ and NH$_3$, an amorphous silicon nitride film was deposited to 300 Å on the above silicon oxide film. Next, according to conventional resist process, the silicon nitride film was arranged with a square shape having one side of 2 μm into hexagonal lattices with intervals of 80 μm, and patterning treatment was effected at other region so that the first silicon oxide surface was exposed. This was then applied with the etching treatment according to the RIE method (reactive ion etching method) to remove unnecessary portions of the silicon nitride film to form the nucleation surfaces (see FIG. 5A).

Next, according to the conventional CVD method, a second silicon oxide film was further deposited to 7000 Å on the substrate having a number of nucleation surfaces comprising fine silicon nitride films at the predetermined positions on the surface as described above. The second silicon oxide film was subjected to the patterning treatment according to Conventional resist process so that only the regular octagonal portion with one side length of 30 m was removed with the fine silicon nitride film as the center to have the nucleation surface exposed. This was applied with the etching treatment according to the conventional RIE method to remove unnecessary portions of the second silicon oxide film (see FIG. 6A).

(2) On the substrate, Si was deposited according to the CVD method. The deposition conditions were made as follows.

| | |
|---|---|
| Gases used (flow rate ratio): | SiH$_2$Cl$_2$/HCl/H$_2$ = 0.53/1.6/100.0 (slm) |
| Substrate temperature and Pressure: | 1000° C., 150 Torr |
| Deposition time: | 90 min. |

As the result, with the centers of substantially all the nucleation surfaces arranged in lattice points as the crystal growth origination points, Si single crystals with a grain size of about 80 μm were grown, which contacted the single crystals grown from the adjacent nucleation surfaces to form a grain boundary. Besides, the sizes of the voids formed at the corner portions were found to be 0.5 μm in diameter or less.

Further, when the upper portion of the Si single crystal was cut by the RIE method, and the sizes of the voids after flattening were observed, the sizes of the voids were found to be also all 0.5 μm or less in diameter.

EXAMPLE 2

First, with the use of a Si (100) wafer substrate as the base material for the substrate, a silicon oxide film with a thickness of about 1000 Å was formed according to the thermal oxidation method.

On the above silicon oxide film was deposited an amorphous silicon (hereinafter abbreviated as a-Si) film according to the reduced pressure CVD method by use of $SiH_4$ under the growth conditions of a substrate temperature of 560° C. and a pressure of 0.3 Torr to a thickness of 1000 Å. When the deposited film was examined by X-ray diffraction, it was confirmed to be a completely amorphous. Then, phosphorus was doped into the a-Si film as the impurity at a concentration of $7.5 \times 10^{20}$ atoms/cm$^3$ by thermal diffusion by use of $POCl_3$.

Next, according to conventional resist process, the a-Si film subjected to the doping (written as "a-Si (P) film") was arranged with square shapes with one side of 2 μm in lattice points at intervals of 80 μm, and the other region was subjected to the patterning treatment so that the surface of the silicon oxide film was exposed. This was applied with the etching treatment by the conventional RIE method (reactive ion etching) to remove unnecessary portion of the a-Si film.

Further, the a-Si (P) films formed finely were annealed. The annealing conditions at that time were made an annealing temperature of 950° C. and an annealing time of 20 minutes in $N_2$ atmosphere. The annealing temperature in this case may be sufficiently 800° C. or higher. After annealing, examination by the X-ray diffraction method revealed that all of the above a-Si (P) films were formed into single crystals with the face orientation regularly in the <111> direction as viewed from above the substrate (single crystalline Si (P) film). This phenomenon is also known in Y. Wada and S. Nishimatsu, J. Electrochem. Soc. 125, 1499 (1978) and others, and called "Abnormal grain growth".

On the substrate having a large number of nucleation surfaces comprised of single crystalline Si (P) films formed on predetermined positions on the surface, a second silicon oxide film was deposited to 7000 Å according to the conventional CVD method. The silicon oxide film was subjected to the patterning treatment according to the conventional resist process so that only the regular octagonal portions with one side of 30 μm were removed with the fine single crystalline Si (P) film as the center to have the above nucleation surface exposed. This was applied with the etching treatment according to the RIE method to remove unnecessary portion of the second silicon oxide film.

On the substrate, Si was deposited according to the CVD method. The deposition conditions were made as follows.

| | |
|---|---|
| Gases used (flow rate ratio): | $SiH_2Cl_2/HCl/H_2 =$ 0.53/1.7/100.0 (l/min) |
| Substrate temperature and Pressure: | 1000° C., 150 Torr |
| Deposition time: | 80 min. |

As the result, the fine single crystalline Si (P) films were epitaxially grown while maintaining their crystallinity, whereby Si single crystals with a grain size of about 70 μm were grown, which contacted the side faces of the second silicon oxide film to cover the surface of the second silicon oxide film. As the result of observation by an optical microscope, the sizes of the voids were found to be all 0.5 μm or less in diameter. When polishing was effected on the Si single crystals according to the selective polishing method, which effects etching of Si but no etching of silicon oxide by placing a polishing cloth against the substrate surface while supplying an aqueous amine solution and rubbing the polishing cloth with the substrate surface, polishing was completed with the second silicon oxide film as the stopper. The substrate thus treated was again subjected to surface observation by an optical microscope, and the sizes of the voids were also found to be all 0.5 μm or less in diameter.

EXAMPLE 3

With the use of a quartz substrate as the base material, etching treatment was applied on the quartz substrate by use of conventional resist process and the RIE method so that circular concavities with a diameter of 80 μm and a depth of 5000 Å were formed.

Next, a silicon nitride film was deposited to about 300 Å according to the reduced pressure CVD method by use of $SiH_2Cl_2$ and $NH_3$. Next, by use of conventional resist process and the RIE method, the silicon nitride film was subjected to the etching treatment so as to be arranged in square shape with one side of 2 μm at the center of the circular concavities, thereby forming a substrate having the nucleation surfaces formed thereon.

On the substrate, Si was deposited according to the CVD method under the following conditions.

| | |
|---|---|
| Gases (flow rate ratio): | $SiH_2Cl_2/HCl/H_2$: 0.53/1.6/100 (l/min.) |
| Substrate temperature and Pressure: | 1000° C., 150 Torr |
| Deposition time: | 90 min. |

As the result, with substantially all the nucleation surfaces as the centers, Si crystal grains of a grain size of 80 μm were found to grow and embedded the circular concavities. When observed by an optical microscope, voids were observed in the vicinity of the side walls of the concavities, but their sizes were all 0.3 μm or less in diameter, and among them, there were also some concavities in which no void was observed by an optical microscope.

Further, Si crystal grains were polished by use of conventional Si wafer polishing step. Polishing was completed when the upper surface of the Si crystal grains became the same height as the upper surface of the quartz substrate, and again observation was made by an optical microscope. As the result, the sizes of the voids were found to be also all 0.3 μm or less in diameter.

EXAMPLE 4

First, by use of a Si (100) wafer as the base material, an amorphous silicon oxide film with a film thickness of 1000 Å was formed on its surface.

Next, a silicon nitride film was deposited to 300 Å according to the conventional reduced pressure CVD method by use of $SiH_2Cl_2$ and $NH_3$.

The silicon nitride film was subjected to the patterning treatment by use of conventional resist process so that the silicon nitride film was arranged in a square shape with one side of 2 μm into hexagonal lattice points with a interval of 80 μm as the nucleation surfaces 502a, 502b ..., with the other region having the amorphous silicon oxide film exposed to become the non-nucleation surface 501, thus forming a substrate (FIG. 5A).

When the crystal growth treatment was applied under the same conditions-as in Example 1, Si single crystal 503a with a grain size of 80 μm was found to grow with the nucleation surfaces arranged in hexagonal lattice points as the center and contact Si single crystal 503b grown from the adjacent nucleation surface, thereby forming a grain boundary. The sizes of the voids 504 formed at the corner portions were found to be all 0.5 μm or less in diameter.

What is claimed is:

1. A method for forming a crystal article on a substrate having a plurality of nucleation surfaces, each of which comprises an amorphous material and serves as a crystal growth origination point, and a non-nucleation surface, which comprises:

(i) forming a plurality of single crystals by applying crystal growth treatment on said substrate having said crystal growth origination points, wherein said growth origination points are arranged at the positions of 5-ply symmetry or greater; and (ii) growing the respective single crystals so as to have each of the respective single crystals in contact with each adjacent single crystal, thereby substantially covering said non-nucleation surface with said single crystals.

2. The method according to claim 1, wherein said single crystal is selected from Si, Ge, GaAs or InP.

3. The method according to claim 1, wherein said crystal growth origination points contain a dopant selected from P, B or As.

4. A method for forming a crystal article on a substrate having a) a plurality of nucleation surfaces, each of which comprises an amorphous material, which is either SiN or SiON, and serves as a crystal growth origination point, and b) a non-nucleation surface, which comprises:

(i) forming a plurality of single crystals by applying crystal growth treatment on said substrate having said crystal growth origination points, wherein said growth origination points are arranged at the positions of 5-ply symmetry or greater; and (ii) growing the respective single crystals so as to have each of the respective single crystals in contact with each adjacent single crystal, thereby substantially covering said non-nucleation surface with said single crystals.

* * * * *

UNITED STATES PATENT AND TRADEMARK OFFICE
CERTIFICATE OF CORRECTION

PATENT NO. : 5,582,641

DATED : December 10, 1996

INVENTOR(S) : NOBUHIKO SATO

It is certified that error appears in the above-identified patent and that said Letters Patent is hereby corrected as shown below:

Title page;
[56] REFERENCES CITED

U.S. PATENT DOCUMENTS, line 7, "van der Brekel" should read --van den Brekel--.
    OTHER PUBLICATIONS, line 5, "submicroslopic" should read --submicroscopic--.
    OTHER PUBLICATIONS, line 8, "pp. 593-504," should read --pp. 593-594,--.

COLUMN 2

Line 27, "intended to" should read --intended for--.
    Line 33, "void 305" should read --void 406--.

COLUMN 3

Line 45, "position," should read --positions,--.
    Line 61, "then" should read --than--.

COLUMN 4

Line 4, "Wigner-Seltz" should read --Wigner-Seitz--.
    Line 23, "wife" should read --wire--.

UNITED STATES PATENT AND TRADEMARK OFFICE
CERTIFICATE OF CORRECTION

PATENT NO. : 5,582,641

DATED : December 10, 1996

INVENTOR(S): NOBUHIKO SATO

It is certified that error appears in the above-identified patent and that said Letters Patent is hereby corrected as shown below:

COLUMN 5

Line 25, "crystal 503a," should read --crystals 503a,--.
    Line 38, "crystal" should read --a crystal--.

COLUMN 6

Line 14, "SION," should read --SiON,--.
    Line 18, "1x10" should read --$1 \times 10^{20}$--.
    Line 34, ".intervals" should read --intervals--.
    Line 35, "region" should read --regions--.
    Line 47, "Conventional" should read --conventional--.

UNITED STATES PATENT AND TRADEMARK OFFICE
CERTIFICATE OF CORRECTION

PATENT NO. : 5,582,641

DATED : December 10, 1996

INVENTOR(S) : NOBUHIKO SATO

It is certified that error appears in the above-identified patent and that said Letters Patent is hereby corrected as shown below:

COLUMN 9

Line 7, "conditions-as" should read --conditions as--.

Signed and Sealed this

Twenty-ninth Day of July, 1997

Attest:

Attesting Officer

BRUCE LEHMAN

Commissioner of Patents and Trademarks